United States Patent
Goodner et al.

(10) Patent No.: US 7,732,936 B2
(45) Date of Patent: Jun. 8, 2010

(54) BUFFER COATING HAVING A PHYSICAL MIXTURE OF HIGH TOUGHNESS POLYMER AND A LOW SHRINKAGE POLYMER

(75) Inventors: Michael D. Goodner, Hillsboro, OR (US); Kevin J. Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 11/516,288

(22) Filed: Sep. 6, 2006

(65) Prior Publication Data

US 2008/0054416 A1    Mar. 6, 2008

(51) Int. Cl.
*H01L 23/28* (2006.01)
*H01L 23/29* (2006.01)
(52) U.S. Cl. .................. 257/787; 257/788; 257/789
(58) Field of Classification Search .......... 257/787, 257/788, 789
See application file for complete search history.

(56) References Cited

U.S. PATENT DOCUMENTS

| 5,053,288 | A  | * | 10/1991 | Hashimoto et al. .......... 428/825 |
| 2005/0123776 | A1 | * | 6/2005 | Yoshikawa .................. 428/447 |
| 2006/0116476 | A1 | * | 6/2006 | Cheng ........................ 525/120 |
| 2006/0154078 | A1 | * | 7/2006 | Watanabe et al. ........... 428/413 |

* cited by examiner

*Primary Examiner*—Phat X Cao
*Assistant Examiner*—Diana C Garrity
(74) *Attorney, Agent, or Firm*—Lee & Hayes, PLLC; Shirley Lee Anderson

(57) ABSTRACT

Embodiments of buffer coatings for semiconductor and integrated circuit manufacturing are presented herein, wherein the buffer coating is provided by mechanically blending a first polymer with at least a second polymer. The mechanically blended polymers producing a buffer coating that provides a barrier that is has an increased toughness and decreased shrinkage.

21 Claims, 4 Drawing Sheets

```
                    400 ─┐
                          ↘
```

402
Recieve a Semiconductive Wafer having a Plurality of Circuits

↓

404
Apply a Buffer Coating to the Wafer over the Circuits, Wherein the Buffer Coating Comprises a Mechanical Blend of at least a First Polymer with at least a Second Polymer, such that Buffer Coating has Increased Toughness Relative to The First Polymer

↓

406
Perform One or More Additional Operations On Coated Wafer Portion In Preparation for Packaging

↓

408
Perform One or More Packaging Operations to Form One or More Integrated Circuit Each Including at least a Portion of the Coated Wafer

BUFFER COATING HAVING A PHYSICAL MIXTURE OF HIGH TOUGHNESS POLYMER AND A LOW SHRINKAGE POLYMER

BACKGROUND

Electronic integrated circuits for microelectronic devices are typically fabricated by creating a large number of circuits in an array on a silicon wafer. The silicon wafers are typically configured as a thin disk of silicon which undergoes a variety of operations to produce the circuits in the silicon wafers. After the circuits are formed, the silicon wafers may be subjected to a variety of additional operations to produce integrated circuits or packages.

For instance, the silicon wafers may be separated into the individual circuit units in preparation for packaging. The individual circuit units are sometimes referred to as "dice" or "dies" and the separating process is sometimes termed "dicing." Further the wafers may undergo packaging processes in which the wafers (or the individual dice from the wafers) are bonded or otherwise joined to a package, such as a printed circuit board (PCB) or other substrate, to form an integrated circuit. However, subsequent operations performed on wafers having circuitry disposed thereon may produce stresses such as thermal loads, mechanical force, and so forth which can cause failures in the wafers and associated circuitry.

BRIEF DESCRIPTION OF THE DRAWINGS

FIG. 4 is a flow diagram depicting a procedure in an exemplary implementation in which integrated circuits including buffer coating layers are formed.

The same reference numbers are utilized in instances in the discussion to reference like structures and components.

DETAILED DESCRIPTION

In the following discussion, exemplary devices are described which may provide and/or utilize techniques to employ buffer coatings, which may have improved toughness. Exemplary procedures are then described which may be employed by the exemplary devices, as well as by other devices without departing from the spirit and scope thereof.

Exemplary Devices

Figure 1:
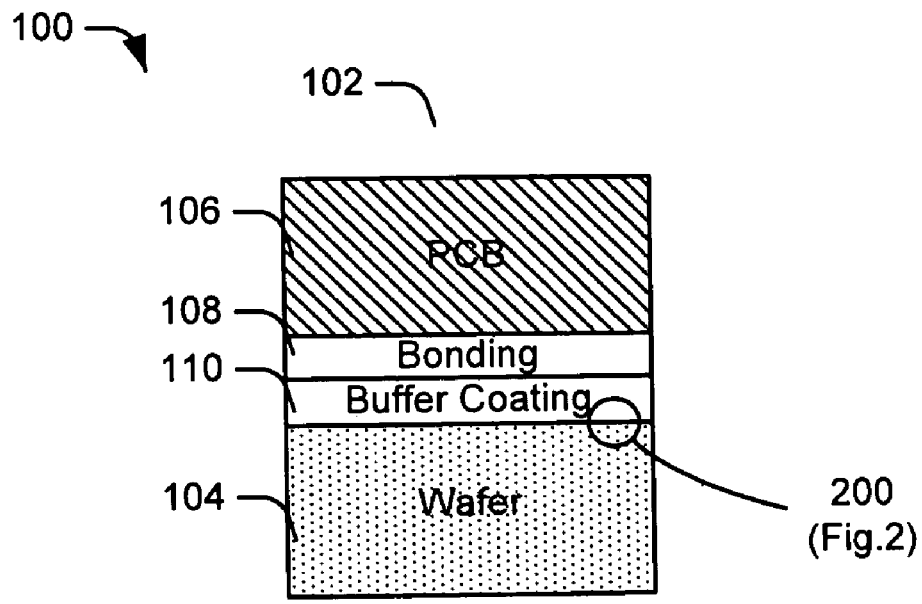
FIG. 1 is an illustration of an exemplary implementation of an integrated circuit having an improved toughness buffer coating layer.

FIG. 1 illustrates an exemplary implementation 100 showing a semiconductive integrated circuit 102 having a buffer coating. The semiconductive integrated circuit 102 may include a wafer 104 layer which is bonded or otherwise joined to a printed circuit board (PCB) 106 or other substrate layer to form the integrated circuit. The joining of the wafer 104 to the PCB 106 may be used to interconnect a plurality of circuits, transistors, wiring and so forth formed on the wafer 104 layer. The wafer 104 layer may comprise any material suitable for forming an integrated circuit 102, such as monocrystalline silicon or other suitable semiconductors.

A bonding 108 layer is depicted which is representative of a variety of structures, techniques, joints, and materials which may be employed to join a semiconductive wafer to the PCB 106 or another substrate. Bonding of a wafer 104 layer to a substrate portion (e.g., PCB 106) is generally referred to as "integrated circuit packaging" or "packaging", further discussion of which may be found in relation to FIG. 4.

Further, buffer coating 110 layer is depicted which may have improved toughness as described below. Operations and processing steps performed in the manufacture of semiconductive integrated circuits may produce a variety of thermal, mechanical, chemical and other stresses, which may cause failure of the manufactured circuits. Accordingly, the buffer coating 110 may be applied to protect the wafer portions 104 and associated circuitry in subsequent operations and uses. For example, the buffer coating 110 may be used to protect the on-chip wiring, circuitry, and so forth and/or to avoid failures encountered during semiconductor processing operations (e.g., dicing and packaging operations), as well as to improve performance in quality testing and end-use. The buffer coating 110 depicted in FIG. 1 may be implemented as an improved toughness buffer coating in accordance with the inventive principles described herein.

Traditionally, to avoid accentuation of surface topography of circuitry disposed on the wafer, a buffer coating that planarizes well (e.g., coats smoothly with a substantially flat and/or uniform surface) and exhibits low shrinkage in curing was selected. Low shrinkage as used herein generally refers to shrinkage of about fifteen percent or less, e.g., less than fifteen percent change in thickness of the buffer coating layer during curing. However, typical buffer coating materials which are selected for good planarization and low shrinkage may be brittle (e.g., exhibit low toughness) and exhibit cracking after processing and end use, such as when subjected to repetitive thermal cycling, intense cure temperatures, and so forth. Toughness may be measured in terms of percent elongation to break and a low toughness generally refers to elongation to break of about nine percent or less. Higher toughness (e.g., less brittle) materials are generally those having elongation to break of ten percent or greater. The percent elongation to break refers to the percent increase in length of a specimen measured at the moment of rupture (break point) during tensile testing.

These high toughness polymers, however, typically exhibit high shrinkage (e.g., greater the fifteen percent) during cure or under thermal loads, which when used as a buffer coating causes the surface topography of the chip to be accentuated. In other words, these higher toughness materials do not planarize well which may lead to development of additional surface topography, which may be problematic when combined with underlying topography from circuitry previously disposed on the wafer. For instance, the accentuated topography may interfere with production of a uniform and compact integrated circuit.

Accordingly, an improved toughness buffer coating 110 is introduced in which a low shrinkage photodefinable polymer, such as a novlak resin blended with a high toughness polymer such as styrene-butadiene rubber (SBR). In an implementation, the polymers are mechanically blended, such as by mechanical stirring or other suitable blending techniques. The resultant blended buffer coating 110 has characteristics of improved toughness and exhibits low shrinkage and therefore may combine the beneficial characteristics of the individual blended polymers. More particularly, polymers for the blend may be selected to produce a buffer coating which exhibits shrinkage of less than fifteen percent (i.e., low shrinkage) and elongation to break of at least ten percent (i.e., high toughness relative to the photo definable base). It is contemplated that an improved toughness buffer coating 110 having these characteristics may be formed from blends of a variety of different polymers, further discussion of which may be found in relation to FIG. 4.

Figure 2:
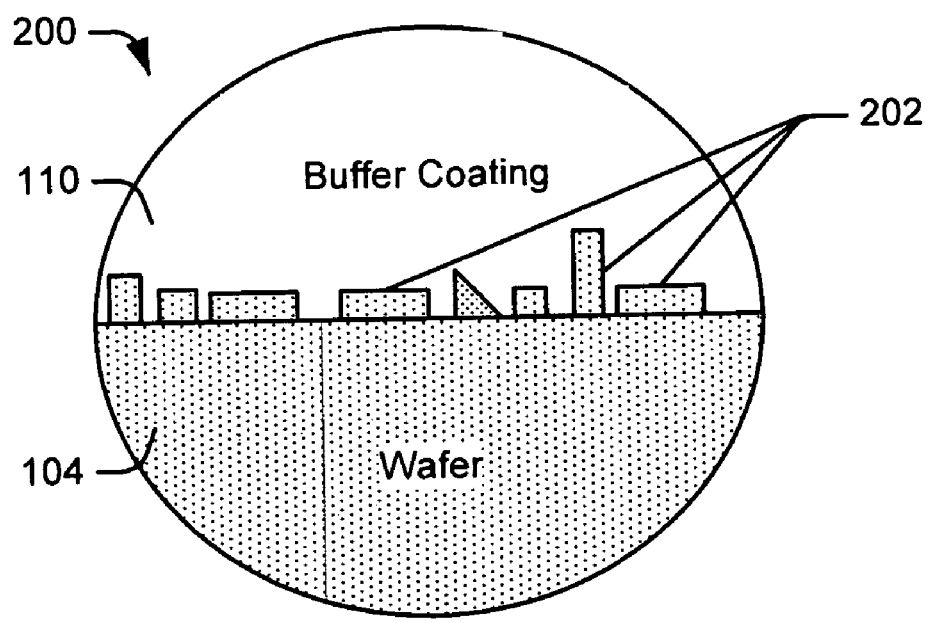
FIG. 2 is an enlarged view of the surface of the wafer layer depicted in FIG. 1 showing exemplary surface topography in greater detail.

Referring to FIG. 2, an enlarged view 200 depicting a portion of the integrated circuit 102 of FIG. 1 is shown in greater detail which has circuitry formed on the surface of the wafer layer. Wafer 104 layer is depicted as having a plurality of circuitry 202 disposed thereon, which creates a surface topography associated with the wafer 104 layer. The circuitry portions 202 represent a variety of structures, devices, components and the like such as transistors, capacitors, on-chip wiring, interconnects, and so forth which may be formed/fabricated on the wafer 104 layer to produce an integrated circuit 102 having selected electrical properties. An improved toughness buffer coating 110 as described herein may then be applied to form a protective layer or film over the wafer 104 layer and associated circuitry. The buffer coating 110 may provide protection to the circuitry of the wafer 104 (e.g., "on-chip" circuitry) during subsequent processing, quality testing, and in end use applications. A variety of subsequent processing of the coated wafer may occur to produce one or more integrated circuits 102 as depicted in FIG. 1, such as interconnections, exposing wiring and/or terminations, dicing, packaging preparations, packaging, and so forth, further discussion of which may be found in relation to FIG. 4.

Figure 3:
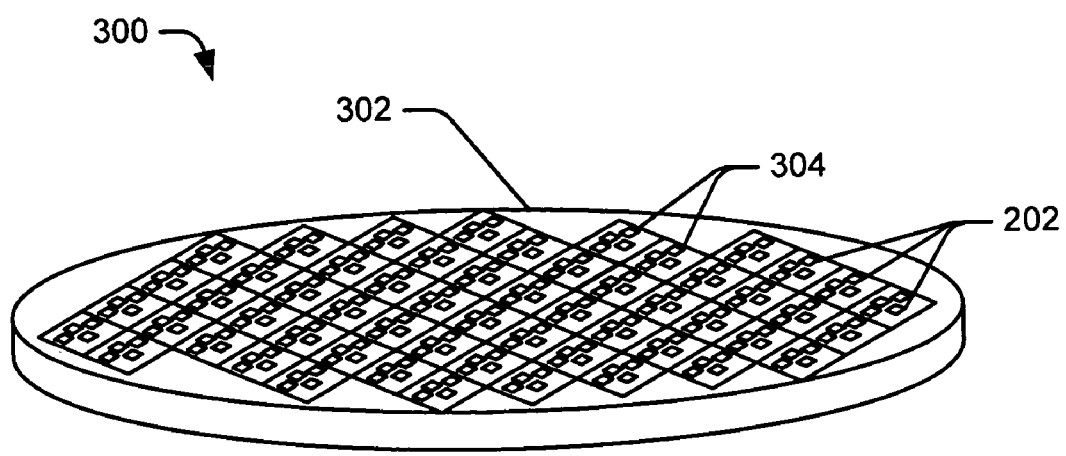
FIG. 3 is an exemplary implementation of semiconductive wafer having an applied buffer coating.

FIG. 3 depicts an exemplary implementation 300 of a semiconductive wafer. A semiconductive wafer 302 configured as a thin silicon disk is depicted. In other implementations, a variety of other semi-conductive materials may be used as those skilled in the art will appreciate. The wafer 302 has a plurality of regions 304 each of which is depicted as having a plurality of circuit portions 202 as previously described with respect to FIG. 2. As those of skill in the art will appreciate, a single semiconductive wafer 302 may produce a plurality of integrated circuits 102 from a plurality of individual circuit portions or "dice" which may be the result of dicing. Thus, the plurality of regions 304 may each represent an individual circuit portion or "dice" portion of a wafer 302 which may be formed in a dicing operation and which may each be packaged to produce an individual integrated circuit 102 as illustrated in FIG. 1. Accordingly, the wafer 104 layer depicted in FIGS. 1 and 2 may represents a portion of a silicon wafer 302 as depicted in FIG. 4. The semiconductive wafer 302 as depicted in FIG. 3 represents a base structure (semiconductive wafer 302 prepared with circuitry 202) to which the improved toughness buffer coating 110 may be applied. Further discussion of applying improved toughness buffer coating 110 to a wafer 302 and/or portions of wafers 302 (e.g., wafer 104 layer) may be found in relation to FIG. 4.

Exemplary Procedures

The following discussion describes buffer coating techniques that may be implemented utilizing the previously described systems and devices. The procedures are shown as a set of blocks that specify operations performed by one or more devices and are not necessarily limited to the orders shown for performing the operations by the respective blocks. In portions of the following discussion, reference will be made to the exemplary devices described in FIGS. 1-3.

FIG. 4 depicts a procedure 400 in an exemplary implementation in which one or more integrated circuits having buffer coatings are produced. A semiconductive wafer having a plurality of circuits is received (block 402). For example, a semiconductive wafer 302 illustrated in FIG. 3 and having a plurality of circuitry portions 202 may be received in an integrated circuit manufacturing process. The received wafer 302 may be formed by the manufacturer, a third party supplier, and so forth and may be provided for further processing in the manufacture of integrated circuits, including application of a buffer coating. For instance, the implementation 300 of FIG. 3 may represent an initial structure for subsequent processing in manufacturing of one or more integrated circuits such as integrated circuit 102 of FIG. 1. Those skilled in the art will appreciated that there are a number of ways that one might arrive at the initial structure illustrated in FIG. 3. For instance, a silicon wafer may be processed according to a variety of techniques including but not limited to deposition, etching, masking, trenching, doping, ion implantation, lithography, and so forth to produce the initial structure. A variety of different circuitry portions 202 including devices such as transistors, capacitors, gates, on chip-wiring, interconnects, and so forth may be formed on the wafer to produce a plurality of integrated circuits 102 having selected electrical properties.

A buffer coating is applied to the wafer over the circuits, wherein the buffer coating comprises a mechanical blend of at least a first polymer with at least a second polymer, such that buffer coating has increased toughness relative to the first polymer individually (block 404). For example, once the circuitry portions 202 have been produced on the wafer 302 to create the desired electrical properties, the wafer 302 may be received in a coating operation to be coated with an improved toughness buffer coating 110. A variety of techniques of applying buffer coatings 110 are contemplated such as spin coating, spray coating, flow dispensing, and other suitable coating techniques. In an implementation, the improved toughness buffer coating 110 may be applied to the entire wafer 302, such as before dicing or otherwise dividing of the wafer 302 into individual circuit portions. Alternatively an improved toughness buffer coating 110 may be applied individually to portions formed from the wafer 302, such as to one or more of the dice following dicing operations.

The improved toughness buffer coating 110 may be formed by blending of a plurality of polymers having different properties to provide a final film having the beneficial properties of both films. For instance at least a first polymer may be blended with another polymer, such that the resulting buffer coating 110 has increased toughness relative to the first polymer.

The first polymer may be a photodefinable low shrinkage polymer, which generally has shrinkage during cure (for example, thermal cure at 250 degrees Celsius for one hour) of about fifteen percent or less. Polymers fitting the description of low-shrinkage photodefinable polymer are: novolak resins and poly(hydroxystyrene) (PHS) available commercially under the trade name WPR including WPR-1020, WPR-1050, and WPR-1201. (WPR is a registered trademark of JSR Corporation, Tokyo, Japan), benzocyclobutene (BCB) available under the trade name CYCLOTENE (CYCLOTENE is a registered trademark of Dow Chemical Co., Midland Mich.), poly(acrylate), poly(methacrylate), alicyclic polymers such as UNITY polynorbomene (UNITY is a registered trademark of Promerus, LLC, Brecksville, Ohio) and epoxy such as SU-8 available commercially from MICROCHEM. (MICROCHEM is a registered trademark of MicroChem Corp., Newton, Mass.). Generally the set of first polymers have low toughness and may be brittle when cured, which may cause cracking or failures under stresses of processing, testing, and use. For instance, these first polymers may range between five to eight percent elongation at break (novolak and PHS on the low end at five to six percent, BCB on the high end at eight percent). Elongation at break of about nine percent or less is indicative of low toughness.

One or more of the first polymers may be blended with at least a second polymer which has relatively higher toughness in comparison to the first polymers. These second polymers have high toughness which is generally indicated by elongation at break of about ten percent or greater. Polymers fitting the description of high toughness are: rubbers (such as silicone rubber, various butyl rubbers, and so on), polybenzoxazole, polybenzimidazole, polyetherimide, polyhydantoin, certain polyamides e.g., aramids such as NOMEX and KEVLAR (NOMEX and KEVLAR are registered trademarks of E. I. du Pont de Nemours and Company, Wilmington, Del.), certain polycarbonates and certain polyesters. The latter three classes of polymers can range in toughness from very brittle to very tough, based upon the particular monomers used in the polymerization. Thus polyamides, polycarbonates and polyesters which have elongation at break of about ten percent or greater may be chosen for the improved buffer coating techniques described herein. In general, materials with high elongation to break shrink considerably during cure. For instance 25-50% shrinkage may occur compared to, fifteen percent or less for low shrinkage photodefinable polymers such as novolak, PHS, and BCB.

Thus, blending of one or more of the first polymers (low shrinkage photodefinable) with one or more of the second polymers (high toughness) is performed to produce a resulting buffer coating exhibiting the beneficial characteristics of each set of polymers. In particular, to form a coating having low-shrinkage (less than fifteen percent) with improved toughness (ten percent or greater elongation at break).

Further, the improved toughness buffer coating 110 may be configured to meet product qualification criteria such as Thermal Cycle Testing (TCT) under one or more set of specified conditions. TCT is commonly used in the semiconductor industry for product qualification (e.g., quality testing) and involves subjecting a specimen alternatively to specified low and high temperatures for a specified number of cycles. Two industry standards that govern TCT are the United States Department of Defense Test Method Standard Microcircuits temperature cycling standard Mil-Std-883 Method 1010 and the JEDEC Solid State Technology Association temperature cycling standard JESD22-A104.

TCT may be performed at a variety of conditions under these standards such that the number of cycles may range from about 10 to 1000, and the temperatures may be between about minus 55 degrees Celsius and 300 degrees Celsius. In an implementation, the improved toughness buffer coating 110 meets performance criteria such that cracks are typically not exhibited when subjected to one or more set of specified TCT conditions; e.g. passes the TCT. For instance, an integrated circuit having improved toughness buffer coating 110 passes TCT conditions having 750 cycles between minus 55 degrees Celsius and 125 degrees Celsius (these conditions correspond to the JEDEC JESD22-A104 standard, condition B) without forming cracks in the buffer coating. A variety of other examples are contemplated, such that a low shrinkage (less than fifteen percent), buffer coating has improved toughness (ten percent or greater elongation to break) and withstands specified TCT conditions without cracking.

The composition of the blend (by weight or volume) may include between about ten percent and ninety percent of the one or more first polymers and blended with a corresponding ninety percent to ten percent of the one or more of the second polymers. Toughness may be further improved to achieve elongation to break of twelve percent or greater while maintaining a shrinkage of less than fifteen percent by employing a buffer coating composition (by weight or volume) having between about 25% to 75% of the one or more first polymers with 25% to 75% of the one or more second polymers.

Table 1 below provides a list of exemplary polymers which may be blended to produce improved toughness buffer coating 110. In accordance with the inventive principles described, one or more polymer selected from each column in Table 1 may be mechanically blended to produce a buffer coating having a low-shrinkage (less than fifteen percent) with improved toughness (ten percent or greater elongation at break).

TABLE 1

| Photodefinable Low-Shrinkage Base Polymer | High Toughness Polymers |
| --- | --- |
| Novolak resins | Rubber (butyl, silicone, etc.) |
| Poly(hydroxystyrene) | Polybenzoxazole |
| Benzocyclobutene | Polybenzimidazole |
| Poly(acrylate) | Polyetherimide |
| Poly(methacrylate) | Polyhydantoin |
| Alicyclic polymers (such as polynorbornene) | Polyamides (aramid, etc.) |
| Epoxy | Polycarbonate |
|  | Polyester |

One or more additional operations are performed in preparation for packaging (block 406). For instance, a silicon wafer 302 having the applied buffer coating 110 may undergo a variety of further operations. For instance, a curing operation may cure the buffer coating 110. The cured buffer coating 110 may then protect underlying circuitry. Additionally, the coated silicon wafer 302 may be separated into the individual circuit units in preparation for packaging. As noted, the individual circuit units are sometimes referred to as "dice" or "dies" and the separating process is sometimes termed "dicing". Those of skill in the art will appreciate that a variety of other operations may also be performed, such as scoring in preparation for dicing, adding die bumps, adding interconnects, masking and etching, ion implantation, exposing wiring, and so forth.

Then, one or more packaging operations are performed to form one or more integrated circuits each including at least a portion of the coated wafer (block 408). For instance, individual portions of the wafer 302 may be formed in a dicing operation, each of which includes a protective buffer coating layer 110 as in FIG. 1. Each individual portion of wafer 302 (each "dice") includes a wafer layer 104 and associated circuitry portion 202 to which the buffer coating 110 has been applied. For instance, each dice may be configured to include the bottom two layers of integrated circuit 102 depicted in FIG. 1 and FIG. 2. A variety of packaging processes are contemplated in which each of the plurality of dice from a coated wafer 302 is bonded or otherwise joined to the PCB portion 106 in the top portion of FIG. 1 to form an integrated circuit 102.

One method of packaging microelectronic circuits is the flip chip process. In flip chip packaging an array of solder balls or die bumps is created on the surface of the silicon wafer 104 to provide a connection to the terminations of the electronic circuitry of the wafer 104. In a subsequent packaging process, the individual circuits of a wafer 104 are placed on a substrate (PCB 106) with the die bumps between the active electronic circuitry and the substrate. By heating this assembly, a soldered connection can be created between a large number of points on the active silicon circuit and the substrate (PCB 106) which provides for the external connections of the packaged microelectronic device. Those skilled in the art will appreciate that a variety of other techniques for packaging microelectronic circuits may be employed. In this manner, a plurality of portions or dice from a coated wafer 302 may be utilized to form a plurality of integrated circuits 102 each including an improved toughness buffer coating 110 layer as depicted in FIG. 1.

Exemplary System

Figure 5:
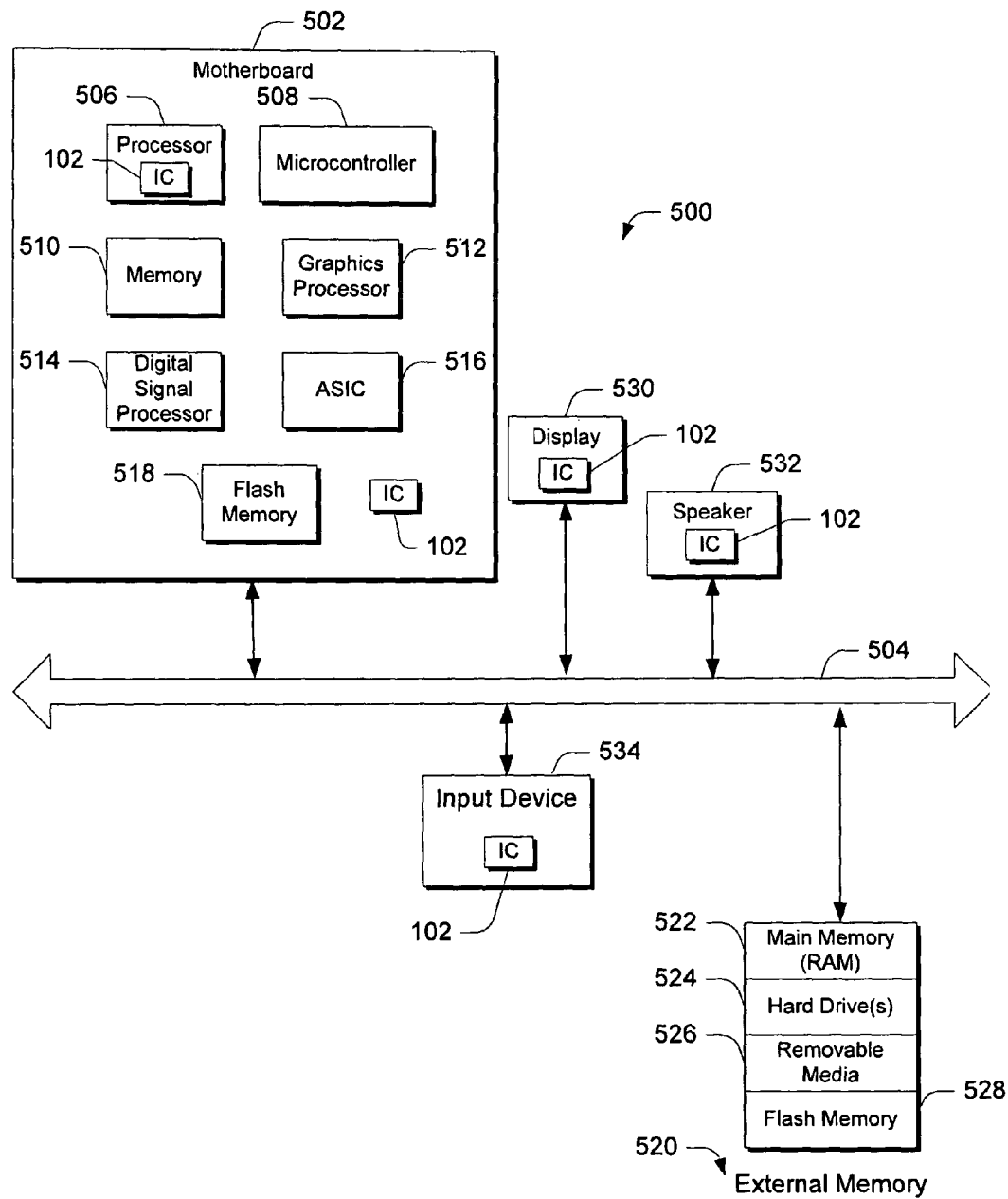
FIG. 5 depicts an implementation of an electronic system which incorporates at least one integrated circuit having a buffer coating.

Referring to FIG. 5, a block diagram of an exemplary implementation 500 of an electronic system is depicted that may include one or more integrated circuits 102 having buffer coatings to protect circuitry. Such an electronic system may comprise a computer system that includes a motherboard 502 which is electrically coupled to various components in electronic system 500 via a system bus 504. System bus 504 may be a single bus or any combination of busses.

Motherboard 502 can include, among other components, one or more processors 506, a microcontroller 508, memory 510, a graphics processor 512 or a digital signal processor 514, and/or a custom circuit or an application-specific integrated circuit 516, such as a communications circuit for use in wireless devices such as cellular telephones, pagers, portable computers, two-way radios, and similar electronic systems and a flash memory device 518. Processor 506 is also illustrated as including an integrated circuit 102 that has been constructed in accordance with the techniques described above. Motherboard 502 may also include one or more additional integrated circuits 102 constructed in accordance with the described techniques, which is associated with the motherboard 502 and/or components of the motherboard 502.

The electronic system 500 may also include an external memory 520 that in turn includes one or more memory elements suitable to the particular application, such as a main memory 522 in the form of random access memory (RAM), one or more hard drives 524, and/or one or more drives that handle removable media 526, such as floppy diskettes, compact disks (CDs) and digital video disks (DVDs). In addition, such external memory may also include a flash memory device 528.

Further, the electronic system 500 may also include a display device 530, a speaker 532, and one or more input devices 534, such as a keyboard, mouse, trackball, game controller, microphone, voice-recognition device, or any other device that inputs information into the electronic system 500. The input device 534 may be operably coupled to the bus 504 to provide inputs for interaction of a user with the system 500, such as to direct the processor 506 and/or one or more application modules executable on the processor 506. Each of the display device 530, speaker 532 and input device 534 are illustrated as including an integrated circuit 102 that has been constructed in accordance with the techniques described above.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An apparatus comprising:
   a semiconductive wafer portion including a plurality of circuits; and
   a buffer coating applied to the semiconductive wafer portion over the circuits, wherein the buffer coating comprises at least a first polymer and at least a second polymer, the first polymer and the second polymer are mechanically blended to produce the buffer coating having:
   increased toughness relative to the first polymer; and
   decreased shrinkage relative to the second polymer.

2. An apparatus as described in claim 1, wherein the first polymer is a photodefinable polymer characterized by shrinkage of about fifteen percent or less.

3. An apparatus as described in claim 2, wherein the second polymer is characterized by elongation to break of about ten percent or greater.

4. An apparatus as described in claim 1, wherein the increased toughness relative to the first polymer is increased relative to an elongation to break for the first polymer in the range of about five percent to eight percent.

5. An apparatus as described in claim 1, wherein the first polymer is a photodefinable polymer selected from the group consisting of:
   a novolak resin;
   benzocyclobutene;
   poly(hydroxystyrene);
   poly(acrylate);
   poly(methacrylate);
   an alicyclic polymer; and
   epoxy.

6. An apparatus as described in claim 1, wherein the first polymer comprises between about ten and ninety percent of the buffer coating.

7. An apparatus as described in claim 1, wherein the buffer coating is configured to undergo a thermal cycling test of at least 750 cycles between about minus 55 degrees Celsius and about 125 degrees Celsius without formation of cracks in the buffer coating.

8. An apparatus as described in claim 1, wherein the decreased shrinkage relative to the second polymer is decreased relative to a shrinkage for the second polymer in the range of about twenty-five percent to fifty percent.

9. An apparatus as described in claim 1, wherein the semiconductive wafer portion is joined to a printed circuit board portion to form an integrated circuit.

10. An apparatus as described in claim 1, wherein
    the second polymer is selected from the group consisting of:
    butyl rubber;
    silicone;
    polybenzoxazole;
    polybenzimidazole;
    polyetherimide;
    polyhydantoin; and
    polycarbonate.

11. An apparatus as described in claim 1, wherein the buffer coating is a protective layer over the semiconductive wafer portion.

12. An apparatus comprising:
    a semiconductive wafer portion including a plurality of circuits; and
    a buffer coating applied to the semiconductive wafer portion over the circuits, wherein the buffer coating comprises at least a first polymer and at least a second polymer,
    the first polymer and the second polymer are mechanically blended, such that the buffer coating has decreased shrinkage relative to the second polymer, wherein the second polymer is characterized by elongation to break of about ten percent or greater.

13. An apparatus as in claim 12, wherein the first polymer is a photodefinable polymer characterized by shrinkage of about fifteen percent or less.

14. An apparatus as described in claim 12, wherein the decreased shrinkage relative to the second polymer is decreased relative to a shrinkage for the second polymer in the range of about twenty-five percent to fifty percent.

15. An apparatus as described in claim 12, wherein the buffer coating has increased toughness relative to an elongation to break for the first polymer in a range of about five to eight percent.

16. A apparatus as described in claim 12, wherein:
the first polymer is selected from the group consisting of:
a novolak resin;
benzocyclobutene;
poly(hydroxystyrene);
poly(acrylate);
poly(methacrylate);
an alicyclic polymer; and
epoxy.

17. An apparatus as described in claim 16, wherein the buffer coating is characterized by:
elongation to break in the range of about ten percent or greater; and
shrinkage of fifteen percent or less.

18. An apparatus as described in claim 12, wherein the buffer coating includes a plurality of photodefmable polymers each characterized by:
shrinkage of about fifteen percent or less; and
elongation to break in the range of about five to eight percent.

19. An apparatus as described in claim 12, wherein the semiconductive wafer portion is joined to a printed circuit board portion via flip-chip packaging.

20. An apparatus as described in claim 12, wherein the second polymer is selected from the group consisting of:
butyl rubber;
silicone;
polybenzoxazole;
polybenzimidazole;
polyetherimide;
polyhydantoin; and
polycarbonate.

21. An apparatus as described in claim 12, wherein the buffer coating is a protective layer over the semiconductive wafer portion.

* * * * *